United States Patent
Chung et al.

(10) Patent No.: US 8,405,118 B2
(45) Date of Patent: *Mar. 26, 2013

(54) MULTICHIP PACKAGE STRUCTURE USING A CONSTANT VOLTAGE POWER SUPPLY

(75) Inventors: Chia-Tin Chung, Toufen Township, Miaoli County (TW); Shih-Neng Dai, Zhongli (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 190 days.

This patent is subject to a terminal disclaimer.

(21) Appl. No.: 12/979,201

(22) Filed: Dec. 27, 2010

(65) Prior Publication Data

US 2012/0097997 A1    Apr. 26, 2012

(30) Foreign Application Priority Data

Oct. 22, 2010  (TW) ............................... 99136124 A

(51) Int. Cl.
*H01L 33/00*    (2010.01)
(52) U.S. Cl. .................. 257/99; 257/100; 257/E33.056; 257/E33.058; 257/E33.059

(58) Field of Classification Search ................ 257/99, 257/100, E33.056, E33.058, E33.059
See application file for complete search history.

(56) References Cited

U.S. PATENT DOCUMENTS

| 2011/0316420 A1* | 12/2011 | Chang et al. ..................... 315/51 |
| 2012/0098458 A1* | 4/2012 | Dai et al. ...................... 315/294 |

* cited by examiner

*Primary Examiner* — Victor A Mandala
(74) *Attorney, Agent, or Firm* — Muncy, Geissler, Olds & Lowe, PLLC

(57) ABSTRACT

A multichip package structure includes a substrate unit, a light-emitting unit, a current-limiting unit, a frame unit and a package unit. The substrate unit includes a first chip-placing region and a second chip-placing region. The light-emitting unit includes a plurality of light-emitting chips electrically connected to the first chip-placing region. The current-limiting unit includes at least one current-limiting chip electrically connected to the second chip-placing region and the light-emitting unit. The frame unit includes a first annular colloid frame surrounding the light-emitting chips and a second annular colloid frame surrounding the current-limiting chip. The package unit includes a first package colloid body surrounded by the first annular colloid frame to cover the light-emitting chips and a second package colloid body surrounded by the second annular colloid frame to cover the current-limiting chip.

10 Claims, 11 Drawing Sheets

MULTICHIP PACKAGE STRUCTURE USING A CONSTANT VOLTAGE POWER SUPPLY

BACKGROUND OF THE INVENTION

1. Field of the Invention

The instant disclosure relates to a multichip package structure, and more particularly, to a multichip package structure using a constant voltage power supply.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One particular aspect of the instant disclosure is to provide a multichip package structure that can use a constant voltage power supply as power supply source.

To achieve the above-mentioned advantages, one embodiment of the instant disclosure provides a multichip package structure, comprising: a substrate unit, a light-emitting unit, a current-limiting unit, a frame unit and a package unit. The substrate unit includes a substrate body having a first chip-placing region and a second chip-placing region formed on the top surface of the substrate body. The light-emitting unit includes a plurality of light-emitting chips electrically connected to and disposed on the first chip-placing region. The current-limiting unit includes at least one current-limiting chip electrically connected to and disposed on the second chip-placing region, and the current-limiting chip is electrically connected to the light-emitting unit. The frame unit includes a first annular colloid frame and a second annular colloid frame surroundingly formed on the top surface of the substrate body. The first annular colloid frame surrounds the light-emitting chips to form a first colloid position limiting space corresponding to the first chip-placing region, and the second annular colloid frame surrounds the current-limiting chip to form a second colloid position limiting space corresponding to the second chip-placing region. The package unit includes a first package colloid body filled into the first colloid position limiting space to cover the light-emitting chips and a second package colloid body filled into the second colloid position limiting space to cover the current-limiting chip.

Therefore, the light-emitting chips and the at least one current-limiting chip are electrically connected to the same substrate body, thus the multichip package structure can use the constant voltage power supply as power supply source.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Figure 1A:
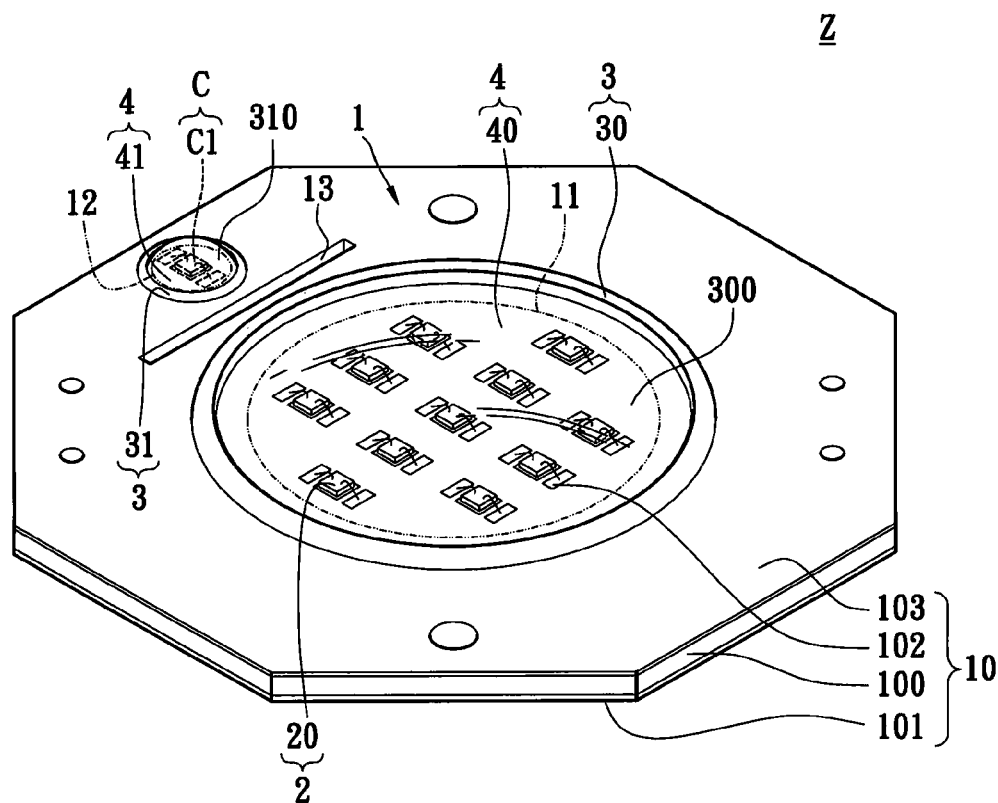
FIG. 1A shows a perspective, schematic view of the multichip package structure according to the first embodiment of the instant disclosure.
Figure 1B:
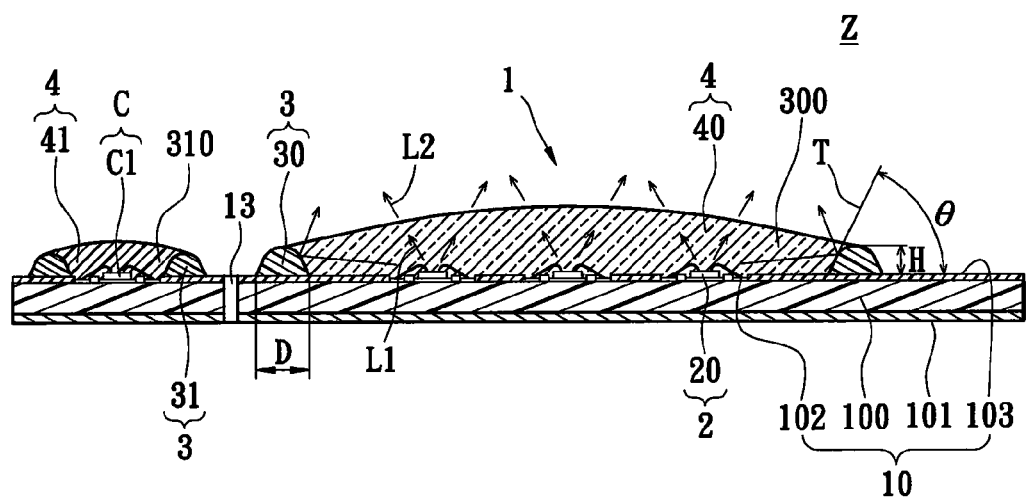
FIG. 1B shows a lateral, cross-sectional, schematic view of the multichip package structure according to the first embodiment of the instant disclosure.
Figure 1C:
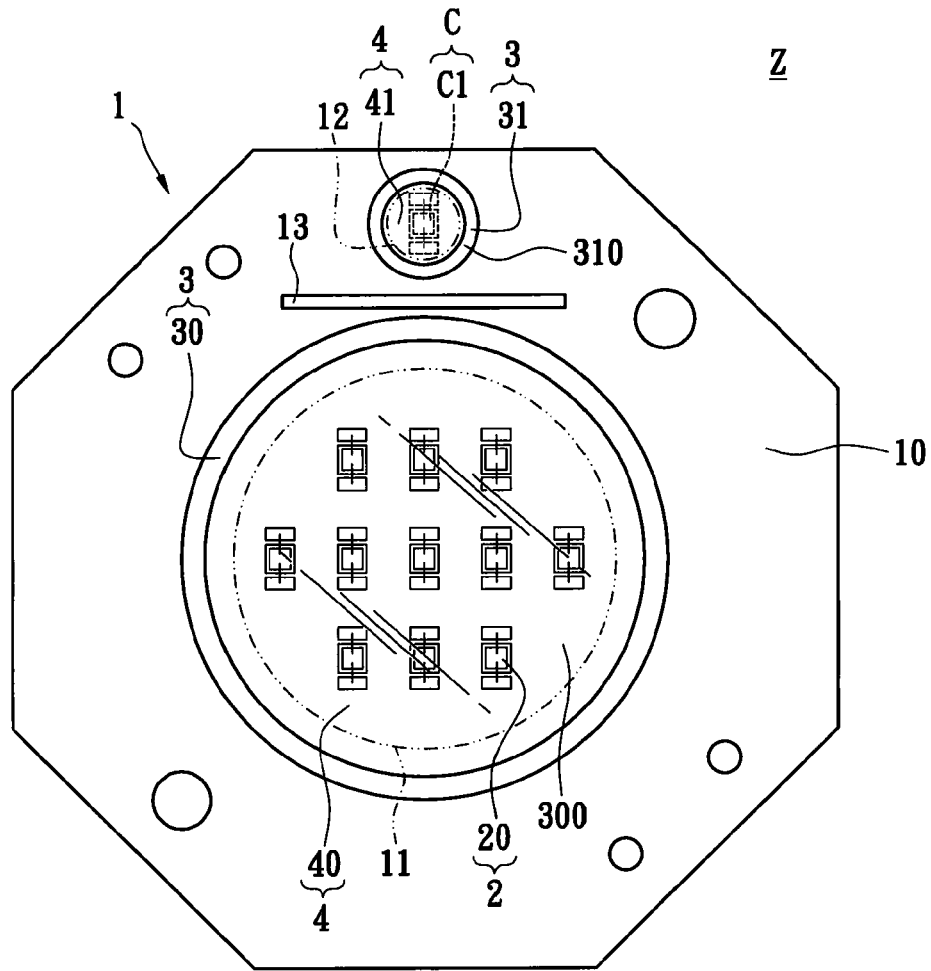
FIG. 1C shows a top, schematic view of the multichip package structure according to the first embodiment of the instant disclosure.

Referring to FIGS. 1A to 1D, the first embodiment of the instant disclosure provides a multichip package structure Z using a constant voltage power supply S. The multichip package structure Z comprises a substrate unit 1, a light-emitting unit 2, a current-limiting unit C, a frame unit 3 and a package unit 4.

The substrate unit 1 includes a substrate body 10 having a first chip-placing region 11 and a second chip-placing region 12 formed on the top surface of the substrate body 10. For example, the substrate body 10 includes a circuit substrate 100, a heat-dissipating layer 101 disposed on the bottom surface of the circuit substrate 100, a plurality conductive pads 102 disposed on the top surface of the circuit substrate 100, and an insulative layer 103 disposed on the top surface of the circuit substrate 100 to expose the conductive pads 102. Hence, the heat-dissipating efficiency of the circuit substrate 100 is increased by using the heat-dissipating layer 101, and the insulative layer 103 is a solder mask for only exposing the conductive pads 102 in order to achieve local soldering. However, the above-mentioned definition of the substrate body 10 is not to limit the instant disclosure, for example, the substrate body 10 can be a PCB (Printed Circuit Board), a flexible substrate, an aluminum substrate, a ceramic substrate, or a copper substrate.

The light-emitting unit 2 includes a plurality of light-emitting chips (bare die state) 20 electrically connected to and disposed on the first chip-placing region 11. For example, each light-emitting chip 20 may be an LED (Light-emitting diode) such as a blue LED, and each light-emitting chip 20 can be electrically connected to the first chip-placing region 11 by wire bonding. In other words, designer can plan a predetermined first chip-placing region 11 on the substrate body 10 in advance, thus the first light-emitting chips 20 can be placed on the first chip-placing region 11.

Figure 1D:
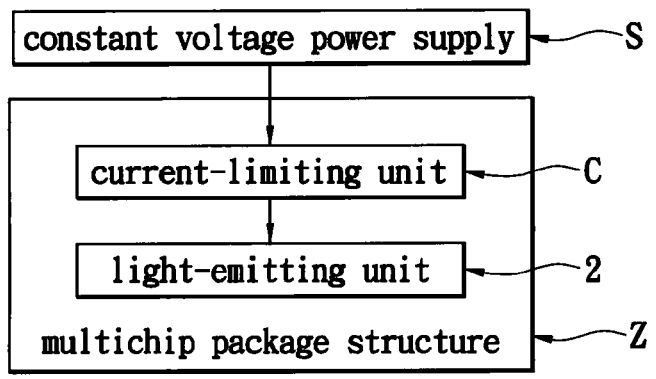
FIG. 1D shows a function block diagram of the multichip package structure according to the first embodiment of the instant disclosure.

The current-limiting unit C includes at least one current-limiting chip C1 electrically connected to and disposed on the second chip-placing region 12, and the current-limiting chip C1 is electrically connected to the light-emitting unit 2. Of courser, the current-limiting unit C can also include a plurality of current-limiting chips C1 on the second chip-placing region 12 for different requirements of amperage or current. For example, the current-limiting chip C1 can be electrically connected to the second chip-placing region 12 by wire bonding and electrically connected between the constant voltage power supply S and the light-emitting unit 2 (as shown in FIG. 1D). In other words, designer can plan a predetermined second chip-placing region 12 on the substrate body 10 in advance, thus the current-limiting chip C1 can be placed on the second chip-placing region 12. In addition, the current-limiting chip C1 is electrically connected between the constant voltage power supply S and the light-emitting unit 2, thus the light-emitting unit 2 can obtain constant voltage from the constant voltage power supply S through the current-limiting chip C1.

The frame unit 3 includes a first annular colloid frame 30 and a second annular colloid frame 31 surroundingly formed on the top surface of the substrate body 10 by coating or other forming method. The first annular colloid frame 30 surrounds the light-emitting chips 20 to form a first colloid position limiting space 300 corresponding to the first chip-placing region 11, and the second annular colloid frame 31 surrounds the current-limiting chip C1 to form a second colloid position limiting space 310 corresponding to the second chip-placing region 12. The first annular colloid frame 30 and the second annular colloid frame 31 are separated from each other by a predetermined distance.

For example, the method for forming the first annular colloid frame 30 (or the second annular colloid frame 31) includes: first, surroundingly coating liquid colloid (not shown) on the top surface of the substrate body 10. In addition, the liquid colloid can be coated on the substrate body 10 to form any shapes according to different requirements (such as a circular shape, a square or a rectangular shape etc.). The thixotropic index of the liquid colloid may be between 4 and 6, the pressure of coating the liquid colloid on the top surface of the substrate body 10 may be between 350 kpa and 450 kpa, and the velocity of coating the liquid colloid on the top surface of the substrate body 10 may be between 5 mm/s and 15 mm/s. The liquid colloid is surroundingly coated on the top surface of the substrate body 10 from a start point to a termination point, and the position of the start point and the position of the termination point are substantially the same, thus the first annular colloid frame 30 (or the second annular colloid frame 31) has a micro convex portion close to the start point and the termination point. Furthermore, the method further includes: hardening or curing the liquid colloid to form a first annular colloid frame 30. In addition, the liquid colloid is hardened by baking, the baking temperature may be between 120° C. and 140° C., and the baking time may be between 20 minute and 40 minute. Therefore, the first annular colloid frame 30 has an arc shape formed on the top surface thereof, the first annular colloid frame 30 has a radius tangent T and the angle θ of the radius tangent T relative to the top surface of the substrate body 10 may be between 40° C. and 50° C., the maximum height H of the first annular colloid frame 30 relative to the top surface of the substrate body 10 may be between 0.3 mm and 0.7 mm, the width D of the bottom side of the first annular colloid frame 30 may be between 1.5 mm and 3 mm, the thixotropic index of the first annular colloid frame 30 may be between 4 and 6, and the first annular colloid frame 30 is formed by mixing inorganic additive with white thermohardening colloid.

The package unit 4 includes a first package colloid body 40 filled into the first colloid position limiting space 300 to cover the light-emitting chips 20 and a second package colloid body 41 filled into the second colloid position limiting space 310 to cover the current-limiting chip C1. The first package colloid body 40 and the second package colloid body 41 are separated from each other by a predetermined distance, and the first annular colloid frame 30 and the second package colloid body 41 are separated from each other by a predetermined distance. For example, the first package colloid body 40 may be a light-permitting colloid body such as cured phosphor colloid or cured transparent colloid, thus blue light beams L1 generated by the light-emitting chips 20 (the blue LED chips) can pass through the first package colloid body 40 (the cured phosphor colloid) to generate white light beams L2 that are similar to the light source generate by sun lamp. In addition, the second package colloid body 41 may be a cured opaque colloid covering the current-limiting chip C1, thus the second package colloid body 41 can prevent the current-limiting chip C1 from being damaged or affected by lighting of the white light beams L2.

The substrate unit 1 further includes at least one heat-insulating slot 13 passing through the substrate body 10, and the heat-insulating slot 13 is formed between the light-emitting unit 2 and the current-limiting unit C or between the first annular colloid frame 30 and the second annular colloid frame 31. Hence, the heat-transmitting path between the light-emitting unit 2 and the current-limiting unit C can be effectively reduced by using the heat-insulating slot 13, thus the velocity of transmitting the heat generated by the current-limiting chip C1 to the light-emitting unit 2 can be effectively decreased.

Figure 2A:
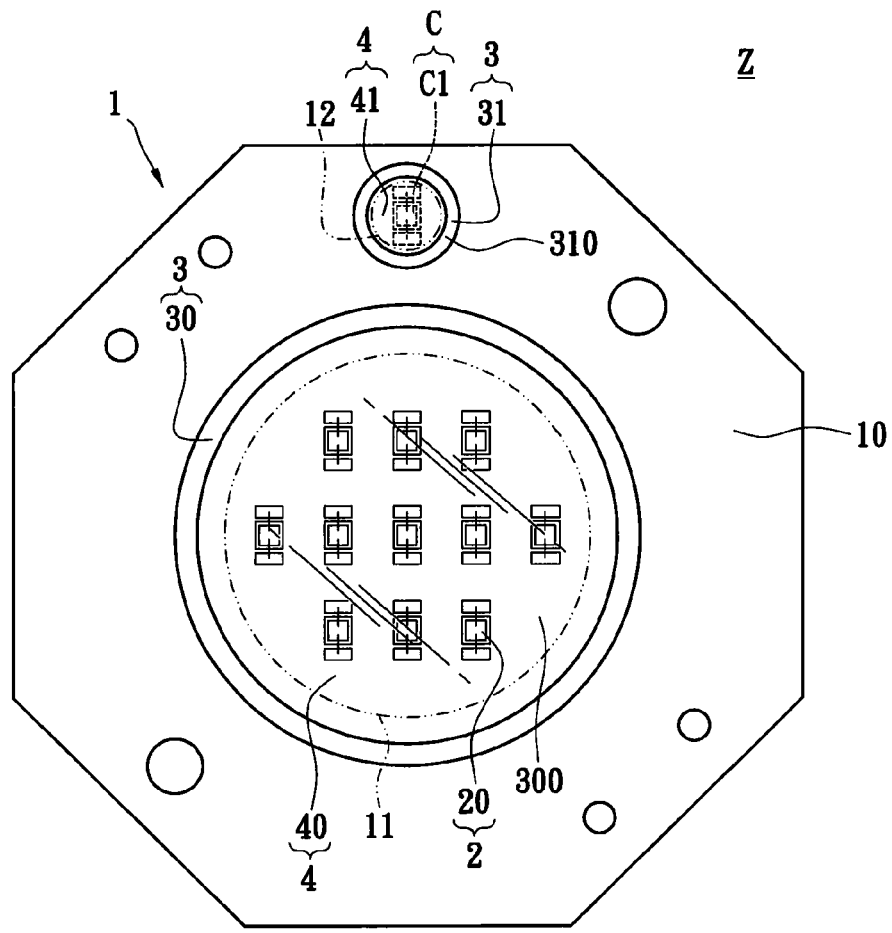
FIG. 2A shows a top, schematic view of the multichip package structure according to the second embodiment of the instant disclosure.
Figure 2B:
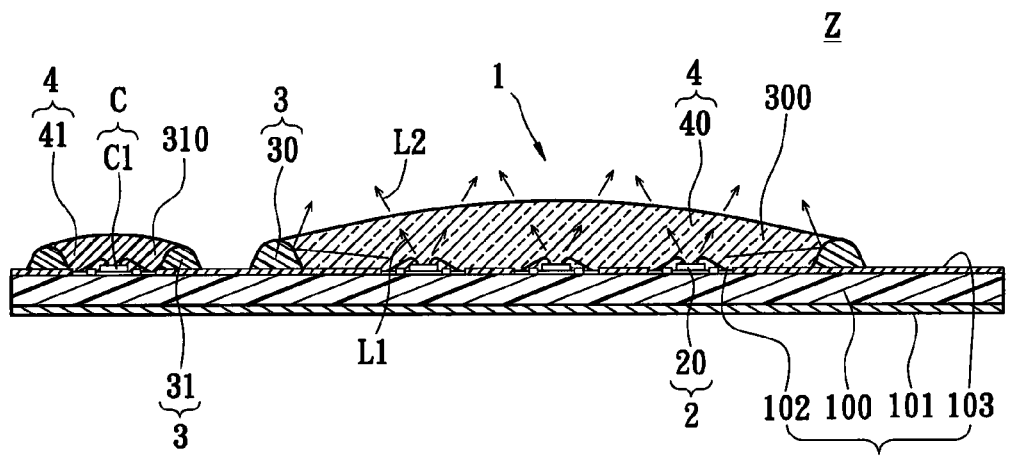
FIG. 2B shows a lateral, cross-sectional, schematic view of the multichip package structure according to the second embodiment of the instant disclosure.

Referring to FIGS. 2A and 2B, the second embodiment of the instant disclosure provides a multichip package structure Z using a constant voltage power supply (not shown). Comparing FIG. 2A with FIG. 1A (or FIG. 2B with FIG. 1B), the difference between the second embodiment and the first embodiment is that: the heat-insulating slot 13 shown in FIG. 2A can be omitted in the second embodiment. For example, when the heat generated by the current-limiting chip C1 is very small, the user can use the second embodiment.

Figure 3:
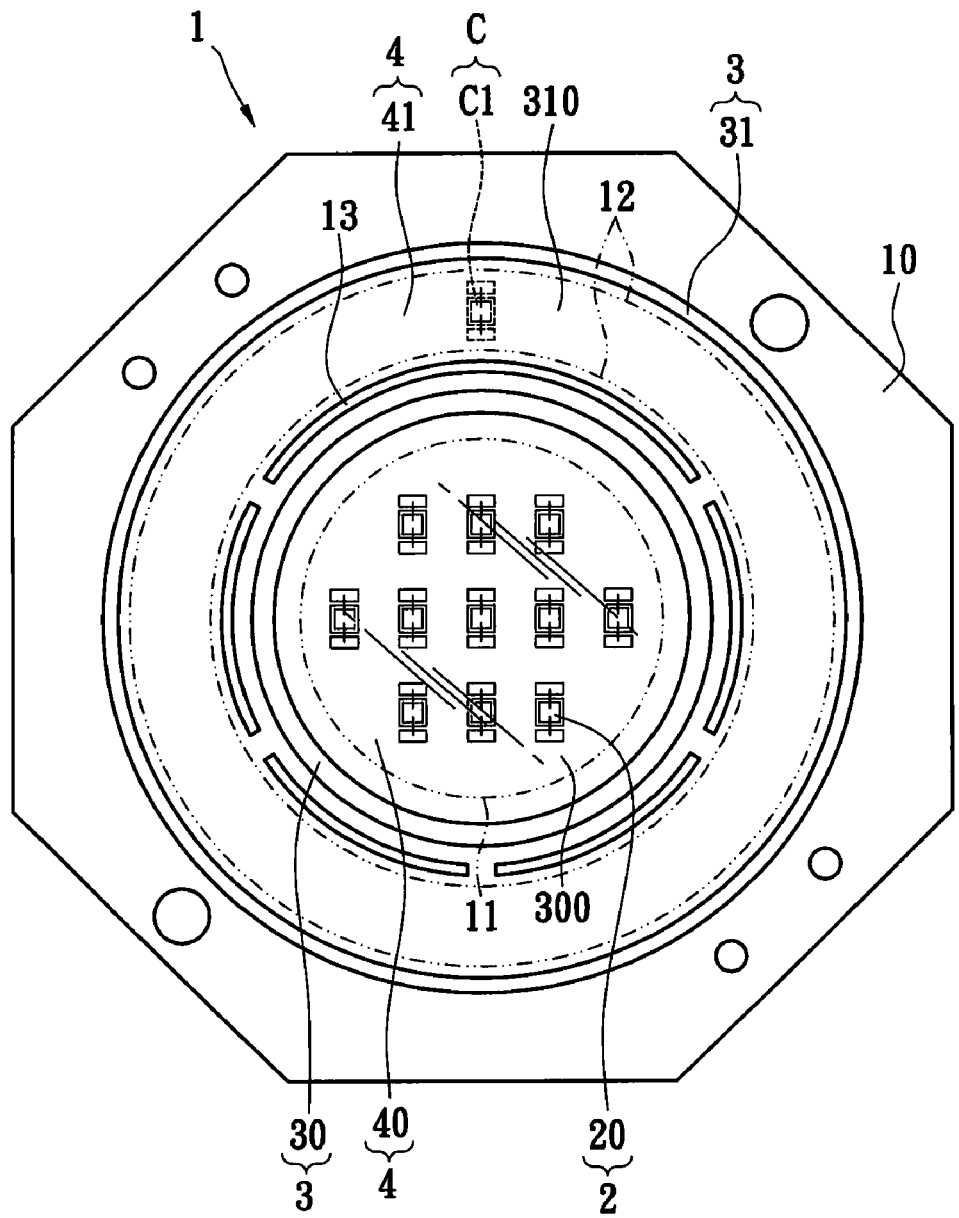
FIG. 3 shows a top, schematic view of the multichip package structure according to the third embodiment of the instant disclosure.

Referring to FIG. 3, the third embodiment of the instant disclosure provides a multichip package structure Z using a constant voltage power supply (not shown). Comparing FIG. 3 with FIG. 1C, the difference between the third embodiment and the first embodiment is that: the current-limiting unit C is disposed between the first annular colloid frame 30 and the second annular colloid frame 31, the second annular colloid frame 31 surrounds the first annular colloid frame 30, the second package colloid body 41 surrounds the first package colloid body 40, and the first annular colloid frame 30 is connected with the second package colloid body 41. In other words, the first annular colloid frame 30 only surrounds the light-emitting chips 20, the second annular colloid frame 31 simultaneously surrounds the light-emitting chips 20, the first annular colloid frame 30 and the current-limiting chip C1, thus the first annular colloid frame 30 and the second annular colloid frame 31 are arranged to form a concentric circle.

The substrate unit 1 further includes at least one heat-insulating slot 13 passing through the substrate body 10, and the heat-insulating slot 13 is formed between the light-emitting unit 2 and the current-limiting unit C or between the first annular colloid frame 30 and the second annular colloid frame 31. Hence, the heat-transmitting path between the light-emitting unit 2 and the current-limiting unit C can be effectively reduced by using the heat-insulating slot 13, thus the velocity of transmitting the heat generated by the current-limiting chip C1 to the light-emitting unit 2 can be effectively decreased. Of course, when the heat generated by the current-limiting chip C1 is very small, the heat-insulating slot 13 shown in FIG. 3 can be omitted.

Figure 4A:
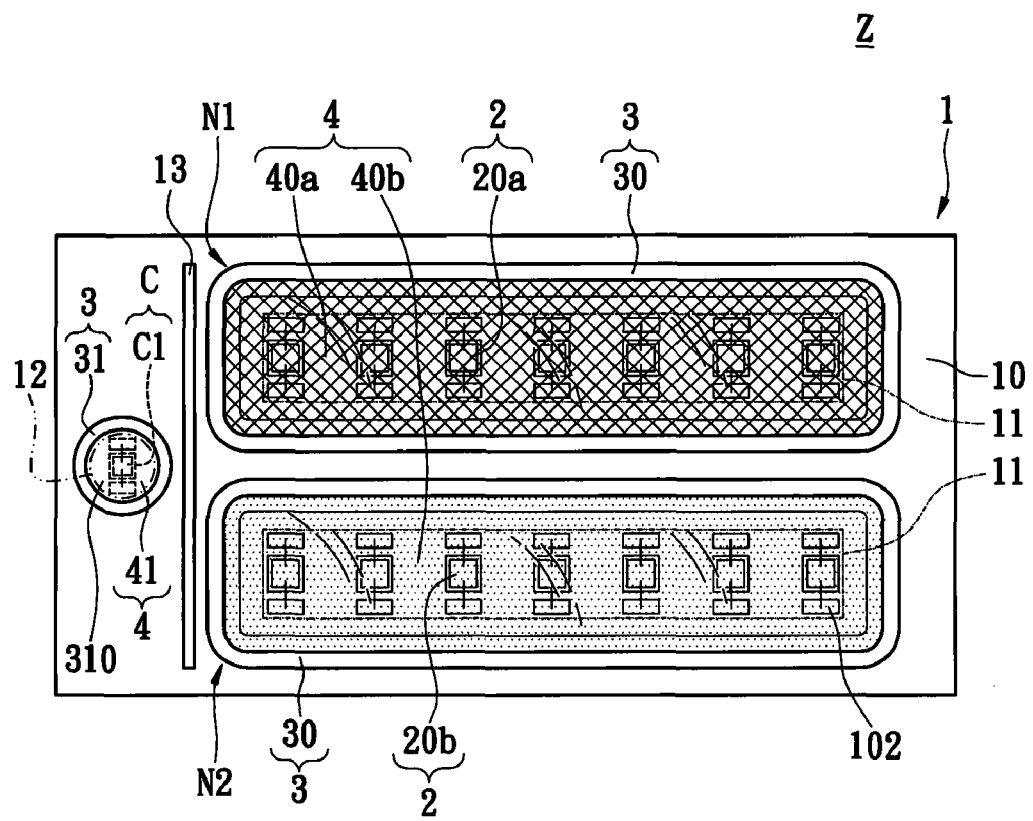
FIG. 4A shows a top, schematic view of the multichip package structure according to the fourth embodiment of the instant disclosure.
Figure 4B:
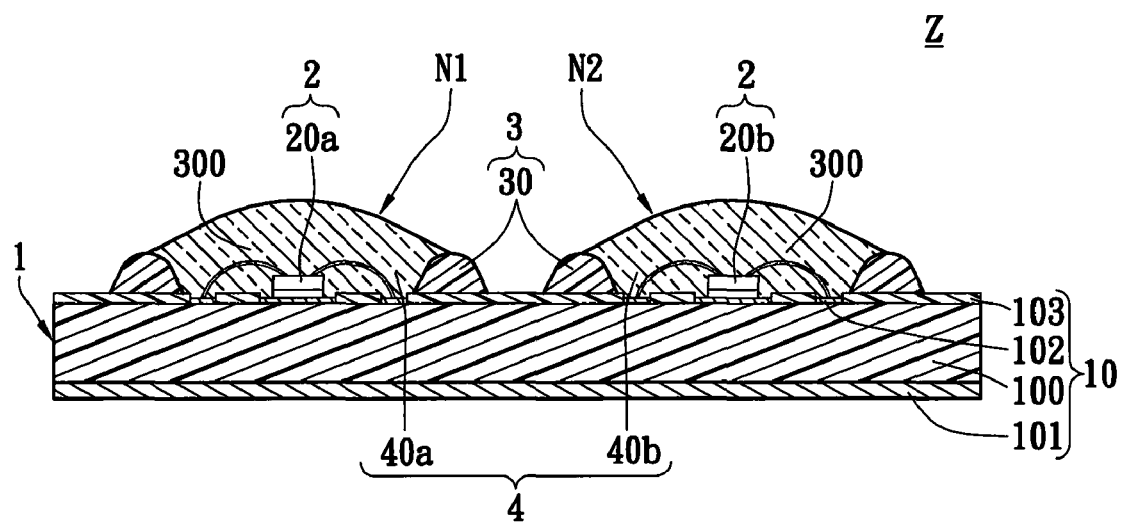
FIG. 4B shows a lateral, cross-sectional, schematic view of the multichip package structure according to the fourth embodiment of the instant disclosure.

Referring to FIGS. 4A and 4B, the fourth embodiment of the instant disclosure provides a multichip package structure Z using a constant voltage power supply (not shown). The multichip package structure Z comprises a substrate unit 1, a light-emitting unit 2, a current-limiting unit C, a frame unit 3 and a package unit 4.

The substrate unit 1 includes a substrate body 10 having two first chip-placing regions 11 and a second chip-placing region 12 formed on the top surface of the substrate body 10. For example, the substrate body 10 includes a circuit substrate 100, a heat-dissipating layer 101 disposed on the bottom surface of the circuit substrate 100, a plurality conductive pads 102 disposed on the top surface of the circuit substrate 100, and an insulative layer 103 disposed on the top surface of the circuit substrate 100 to expose the conductive pads 102.

The light-emitting unit 2 includes at least one first light-emitting module 2a for generating first color temperature and at least one second light-emitting module 2b for generating second color temperature. The first light-emitting module 2a includes a plurality of first light-emitting chips 20a electrically connected to and disposed on one of the first chip-placing regions 11, and the second light-emitting module 2b includes a plurality of second light-emitting chips 20b electrically connected to and disposed on the other first chip-placing region 11. For example, each first light-emitting chip 20a and each second light-emitting chip 20b may be a blue LED, and each first light-emitting chip 20a and each second light-emitting chip 20b can be respectively and electrically connected to the two first chip-placing regions 11 by wire bonding.

The current-limiting unit C includes at least one current-limiting chip C1 electrically connected to and disposed on the second chip-placing region 12, and the current-limiting chip C1 is electrically connected to the light-emitting unit 2. Of courser, the current-limiting unit C can also include a plurality of current-limiting chips C1 on the second chip-placing region 12 for different requirements of amperage or current. For example, the current-limiting chip C1 can be electrically connected to the second chip-placing region 12 by wire bonding and electrically connected between the constant voltage power supply (not shown) and the light-emitting unit 2. In addition, the current-limiting chip C1 is electrically connected between the constant voltage power supply (not shown) and the light-emitting unit 2, thus the light-emitting unit 2 can obtain constant voltage from the constant voltage power supply (not shown) through the current-limiting chip C1.

The frame unit 3 includes two first annular colloid frames 30 and a second annular colloid frame 31 surroundingly formed on the top surface of the substrate body 10 by coating or other forming method. The two first annular colloid frames 30 respectively surround the first light-emitting module 2a and the second light-emitting module 2b to respectively form two first colloid position limiting spaces 300 corresponding to the two first chip-placing regions 11, and the second annular colloid frame 31 surrounds the current-limiting chip C1 to form a second colloid position limiting space 310 corresponding to the second chip-placing region 12. The two first annular colloid frames 30 are separated from each other and arranged on the substrate body 10 in parallel, and each first annular colloid frame 30 and the second annular colloid frame 31 are separated from each other.

The package unit 4 includes two first package colloid bodies (40a, 40b) and a second package colloid body 41. The two first package colloid bodies (40a, 40b) are respectively filled into the two first colloid position limiting spaces 300 to respectively cover the first light-emitting module 2a and the second light-emitting module 2b, and the second package colloid body 41 is filled into the second colloid position limiting space 310 to cover the current-limiting chip C1. Each first package colloid bodies (40a, 40b) and the second package colloid body 41 are separated from each other, and each first annular colloid frame 30 and the second package colloid body 41 are separated from each other. For example, one first package colloid body 40a may be a cured phosphor colloid with first color, the other first package colloid body 40b may be a cured phosphor colloid with second color, and the second package colloid body 41 may be a cured opaque colloid.

The substrate unit 1 further includes at least one heat-insulating slot 13 passing through the substrate body 10, and the heat-insulating slot 13 is formed between the light-emitting unit 2 and the current-limiting unit C or between one of the two first annular colloid frames 30 and the second annular colloid frame 31, thus the velocity of transmitting the heat generated by the current-limiting chip C1 to the light-emitting unit 2 can be effectively decreased. Of course, when the heat generated by the current-limiting chip C1 is very small, the heat-insulating slot 13 can be omitted.

The first light-emitting structure N1 may comprises the substrate body 10, the first light-emitting chips 20a, one first annular colloid frame 30 and one first package colloid body

40a. The second light-emitting structure N2 may comprises the substrate body 10, the second light-emitting chips 20b, the other first annular colloid frame 30 and the other first package colloid body 40b.

Figure 5A:
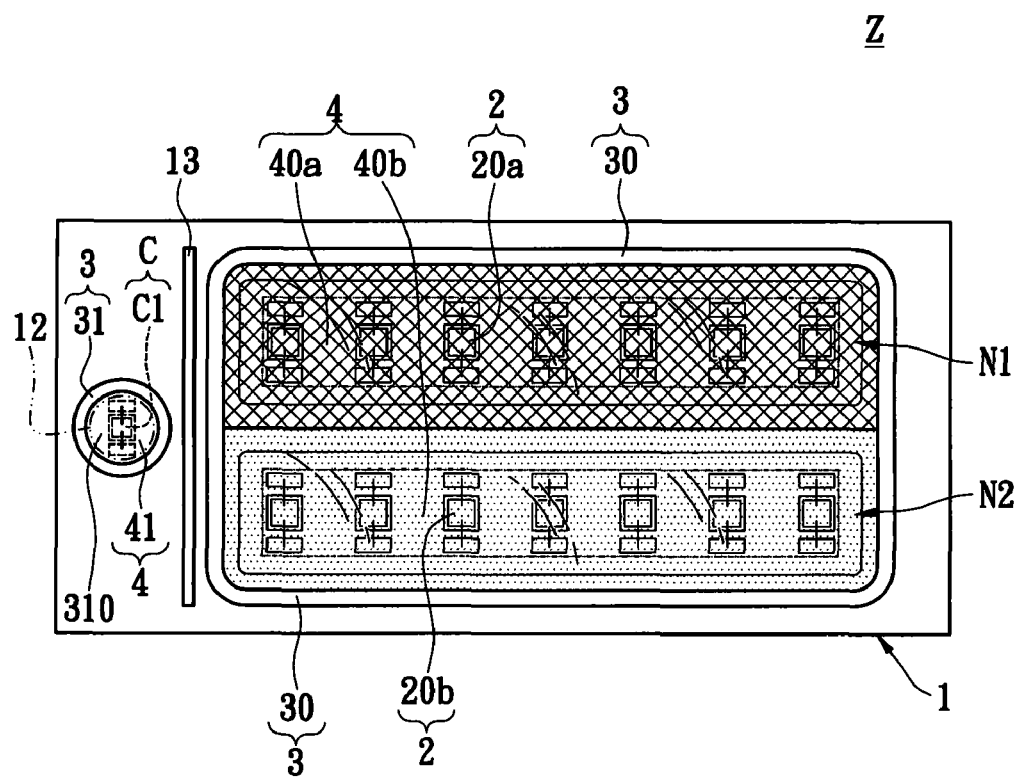
FIG. 5A shows a top, schematic view of the multichip package structure according to the fifth embodiment of the instant disclosure.
Figure 5B:
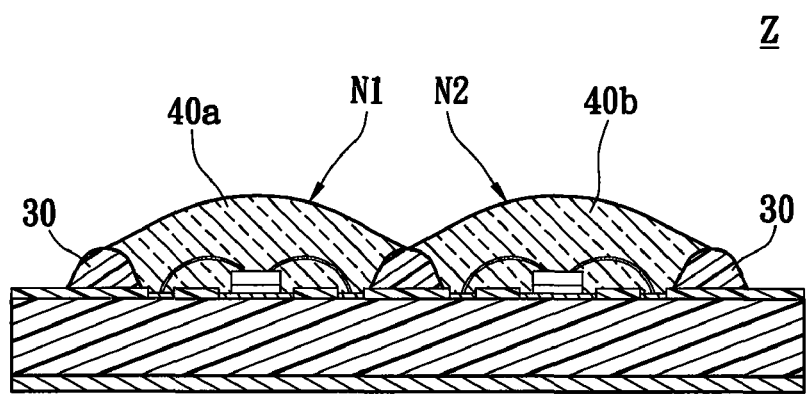
FIG. 5B shows a lateral, cross-sectional, schematic view of the multichip package structure according to the fifth embodiment of the instant disclosure.

Referring to FIGS. 5A and 5B, the fifth embodiment of the instant disclosure provides a multichip package structure Z using a constant voltage power supply (not shown). Comparing FIG. 5A with FIG. 4A (or FIG. 5B with FIG. 4B), the difference between the fifth embodiment and the fourth embodiment is that: in the fifth embodiment, the two first annular colloid frames 30 can be arranged on the substrate body 10 in series.

Figure 6A:
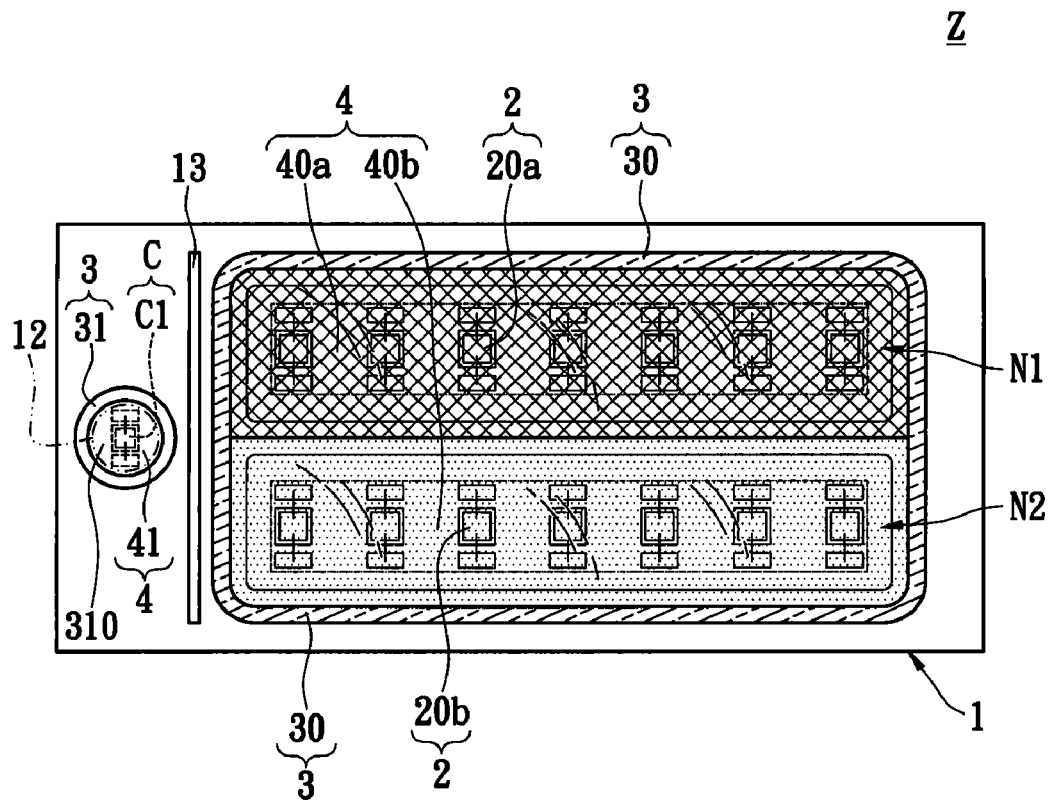
FIG. 6A shows a top, schematic view of the multichip package structure according to the sixth embodiment of the instant disclosure.
Figure 6B:
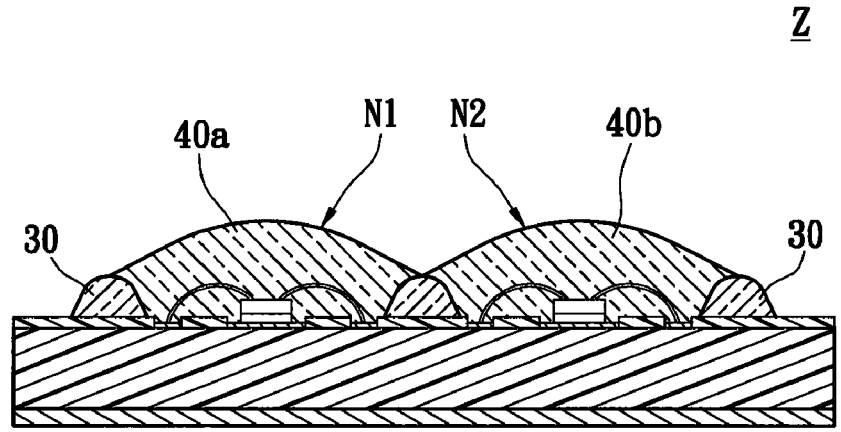
FIG. 6B shows a lateral, cross-sectional, schematic view of the multichip package structure according to the sixth embodiment of the instant disclosure.

Referring to FIGS. 6A and 6B, the sixth embodiment of the instant disclosure provides a multichip package structure Z using a constant voltage power supply (not shown). Comparing FIG. 6A with FIG. 5A (or FIG. 6B with FIG. 5B), the difference between the sixth embodiment and the fifth embodiment is that: in the sixth embodiment, each first annular colloid frame 30 may be a cured phosphor colloid. In other words, phosphor powders can be selectively add to each first annular colloid frame 30 according to different requirements, thus dark bands generated between the two first package colloid bodies (40a, 40b) can be effectively decreased or eliminated.

Figure 7A:
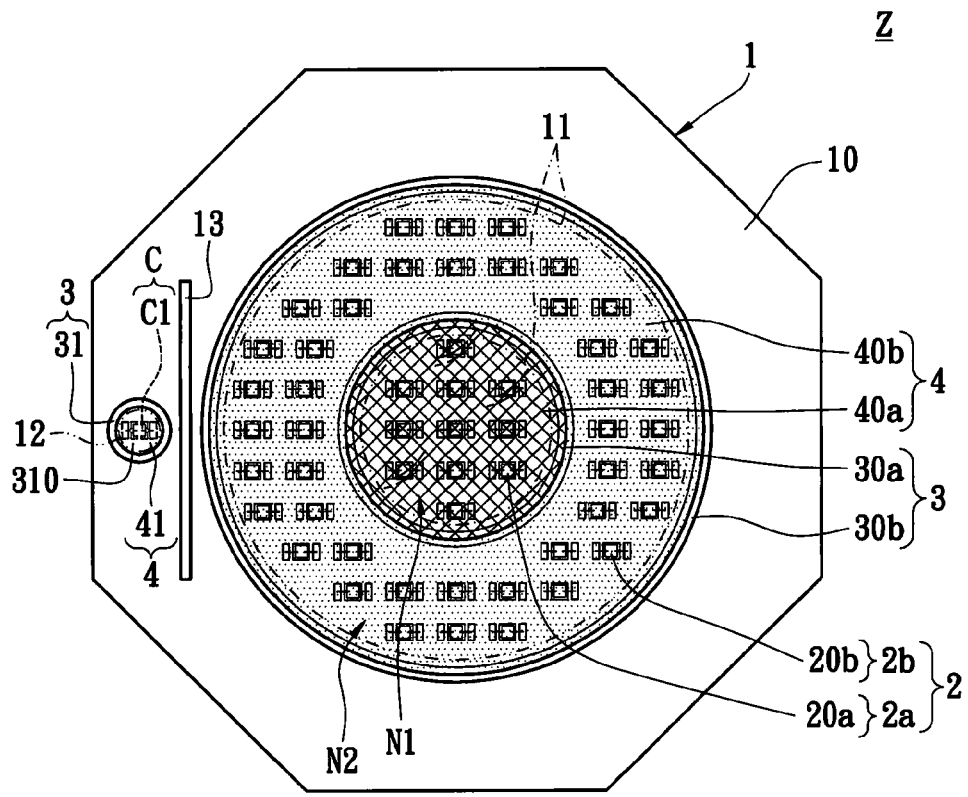
FIG. 7A shows a top, schematic view of the multichip package structure according to the seventh embodiment of the instant disclosure.
Figure 7B:
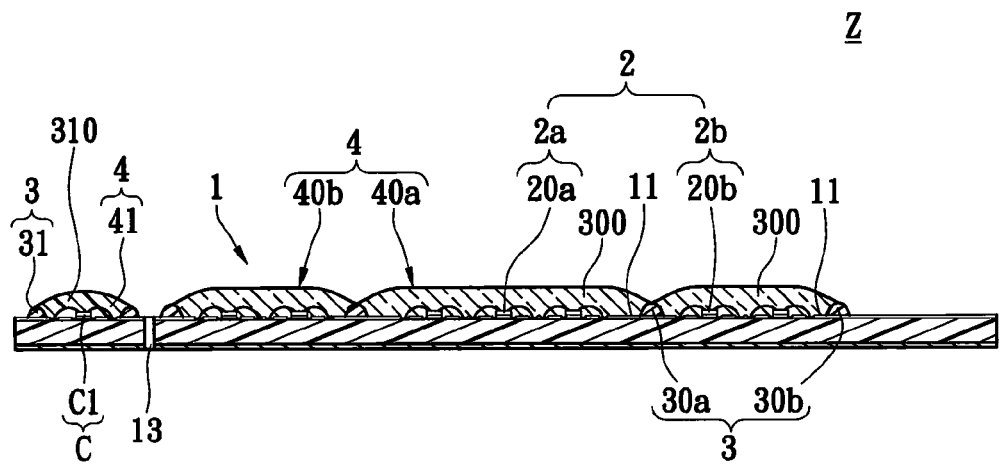
FIG. 7B shows a lateral, cross-sectional, schematic view of the multichip package structure according to the seventh embodiment of the instant disclosure.

Referring to FIGS. 7A and 7B, the seventh embodiment of the instant disclosure provides a multichip package structure Z using a constant voltage power supply (not shown). The multichip package structure Z comprises a substrate unit 1, a light-emitting unit 2, a current-limiting unit C, a frame unit 3 and a package unit 4.

The substrate unit 1 includes a substrate body 10 having two first chip-placing regions 11 and a second chip-placing region 12 formed on the top surface of the substrate body 10. The light-emitting unit 2 includes at least one first light-emitting module 2a for generating first color temperature and at least one second light-emitting module 2b for generating second color temperature. The first light-emitting module 2a includes a plurality of first light-emitting chips 20a electrically connected to and disposed on one of the first chip-placing regions 11, and the second light-emitting module 2b includes a plurality of second light-emitting chips 20b electrically connected to and disposed on the other first chip-placing region 11. The current-limiting unit C includes at least one current-limiting chip C1 electrically connected to and disposed on the second chip-placing region 12, and the current-limiting chip C1 is electrically connected to the light-emitting unit 2.

The frame unit 3 includes two first annular colloid frames (30a, 30b) and a second annular colloid frame 31 surroundingly formed on the top surface of the substrate body 10 by coating or other forming method. One first annular colloid frame 30b surrounds the other first annular colloid frame 30a, thus the two first annular colloid frames (30a, 30b) are arranged to form a concentric circle. The two first annular colloid frames (30a, 30b) respectively surround the first light-emitting module 2a and the second light-emitting module 2b to respectively form two first colloid position limiting spaces 300 corresponding to the two first chip-placing regions 11, the second light-emitting module 2b is disposed between the two first annular colloid frames (30a, 30b), and the second annular colloid frame 31 surrounds the current-limiting chip C1 to form a second colloid position limiting space 310 corresponding to the second chip-placing region 12. The package unit 4 includes two first package colloid bodies (40a, 40b) and a second package colloid body 41. The two first package colloid bodies (40a, 40b) are respectively filled into the two first colloid position limiting spaces 300 to respectively cover the first light-emitting module 2a and the second light-emitting module 2b, and the second package colloid body 41 is filled into the second colloid position limiting space 310 to cover the current-limiting chip C1.

The substrate unit 1 further includes at least one heat-insulating slot 13 passing through the substrate body 10, and the heat-insulating slot 13 is formed between the light-emitting unit 2 and the current-limiting unit C or between one of the two first annular colloid frames 30b and the second annular colloid frame 31, thus the velocity of transmitting the heat generated by the current-limiting chip C1 to the light-emitting unit 2 can be effectively decreased. Of course, when the heat generated by the current-limiting chip C1 is very small, the heat-insulating slot 13 can be omitted.

The first light-emitting structure N1 may comprises the substrate body 10, the first light-emitting chips 20a, one first annular colloid frame 30a and one first package colloid body 40a. The second light-emitting structure N2 may comprises the substrate body 10, the second light-emitting chips 20b, the other first annular colloid frame 30b and the other first package colloid body 40b. In addition, the second light-emitting structure N2 with high color temperature can be an outer ring to surround the first light-emitting structure N1 with low color temperature.

Figure 8:
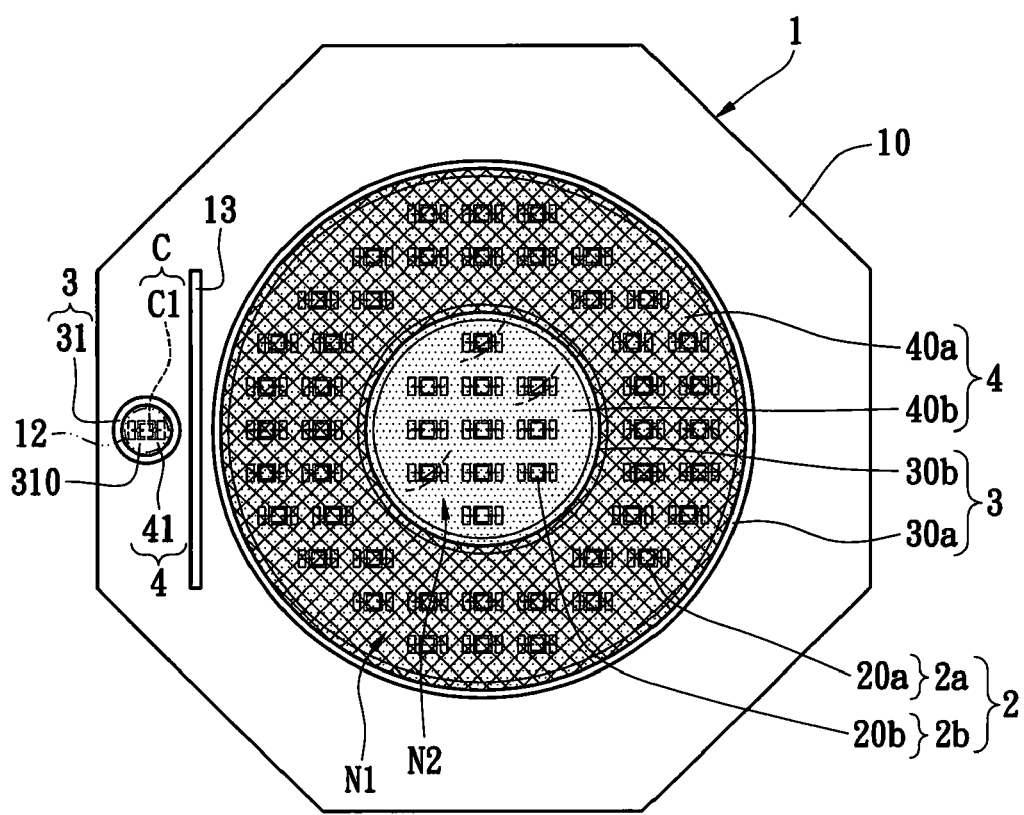
FIG. 8 shows a top, schematic view of the multichip package structure according to the eighth embodiment of the instant disclosure.

Referring to FIG. 8, the eighth embodiment of the instant disclosure provides a multichip package structure Z using a constant voltage power supply (not shown). Comparing FIG. 8 with FIG. 7A, the difference between the eighth embodiment and the seventh embodiment is that: in the eighth embodiment, the first light-emitting structure N1 with low color temperature can be an outer ring to surround the second light-emitting structure N2 with high color temperature.

Figure 9A:
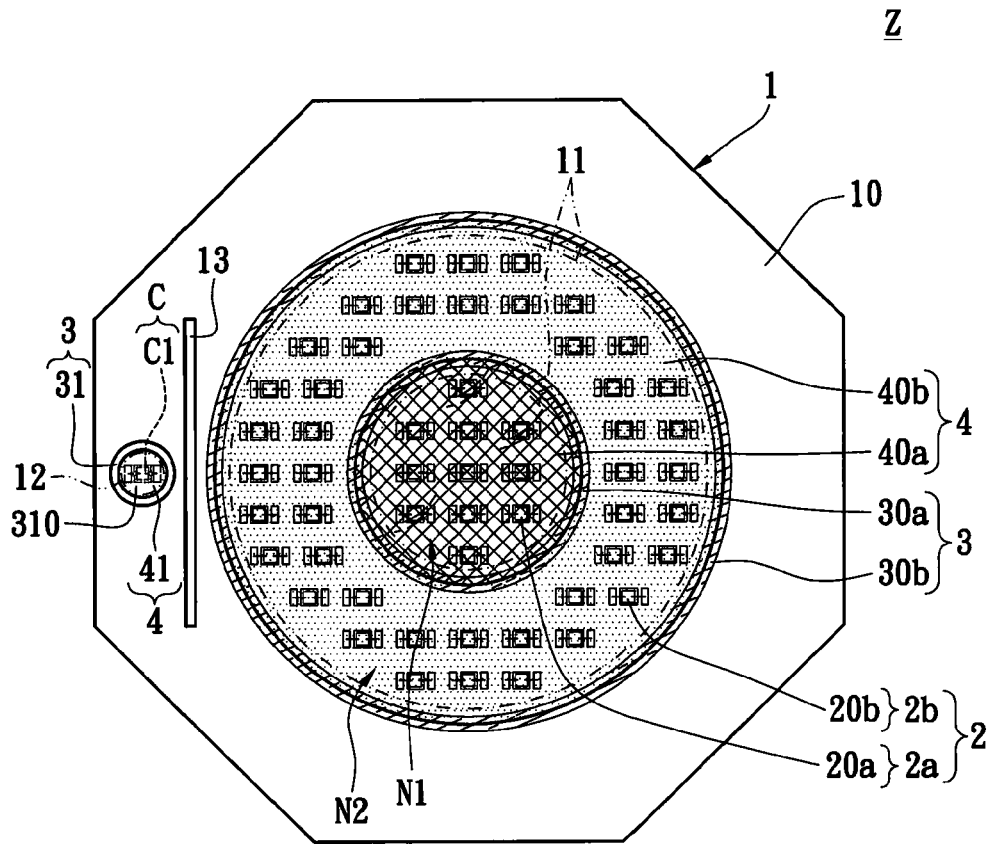
FIG. 9A shows a top, schematic view of the multichip package structure according to the ninth embodiment of the instant disclosure.
Figure 9B:
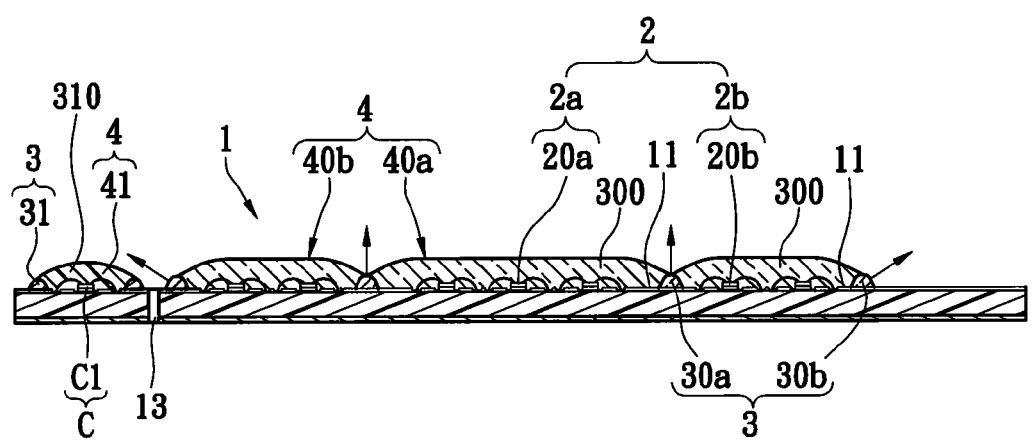
FIG. 9B shows a lateral, cross-sectional, schematic view of the multichip package structure according to the ninth embodiment of the instant disclosure.

Referring to FIGS. 9A and 9B, the ninth embodiment of the instant disclosure provides a multichip package structure Z using a constant voltage power supply (not shown). Comparing FIG. 9A with FIG. 7A (or FIG. 9B with FIG. 7B), the difference between the ninth embodiment and the seventh embodiment is that: in the ninth embodiment, each first annular colloid frame (30a, 30b) may be a cured phosphor colloid. In other words, phosphor powders can be selectively add to each first annular colloid frame (30a, 30b) according to different requirements, thus dark bands generated between the two first package colloid bodies (40a, 40b) can be effectively decreased or eliminated.

Figure 10:
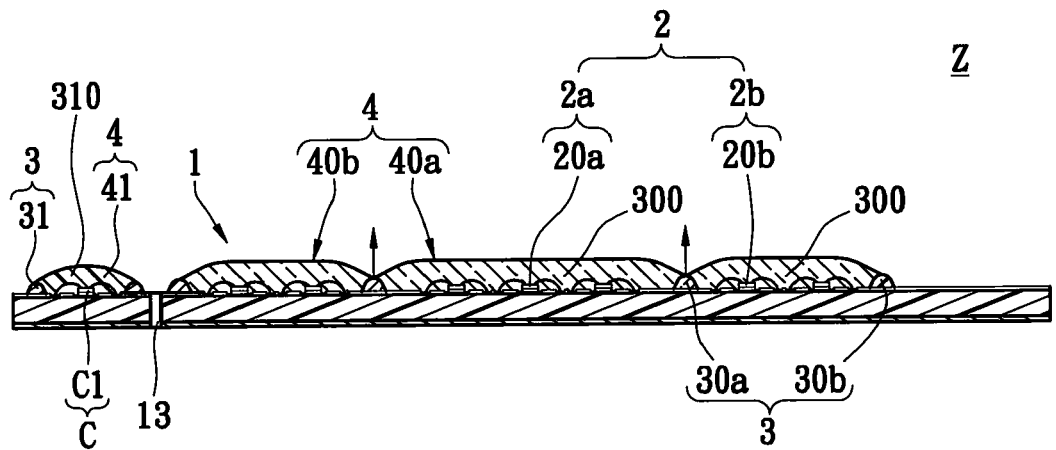
FIG. 10 shows a lateral, cross-sectional, schematic view of the multichip package structure according to the tenth embodiment of the instant disclosure.

Referring to FIG. 10, the tenth embodiment of the instant disclosure provides a multichip package structure Z using a constant voltage power supply (not shown). Comparing FIG. 10 with FIG. 7B, the difference between the tenth embodiment and the seventh embodiment is that: in the tenth embodiment, the inner first annular colloid frame 30a may be a cured phosphor colloid and the outer first annular colloid frame 30b may be a cured light-reflecting colloid. In other words, phosphor powders can be selectively add to the inner first annular colloid frame 30a according to different requirements, thus light beams generated by the light-emitting unit 2 can be transmitted into the inner first annular colloid frame 30a for effectively decreasing or eliminating dark bands generated between the two first package colloid bodies (40a, 40b). In addition, light beams generated by the light-emitting unit 2 can be effectively reflected or condensed by the outer first annular colloid frame 30b.

Figure 11:
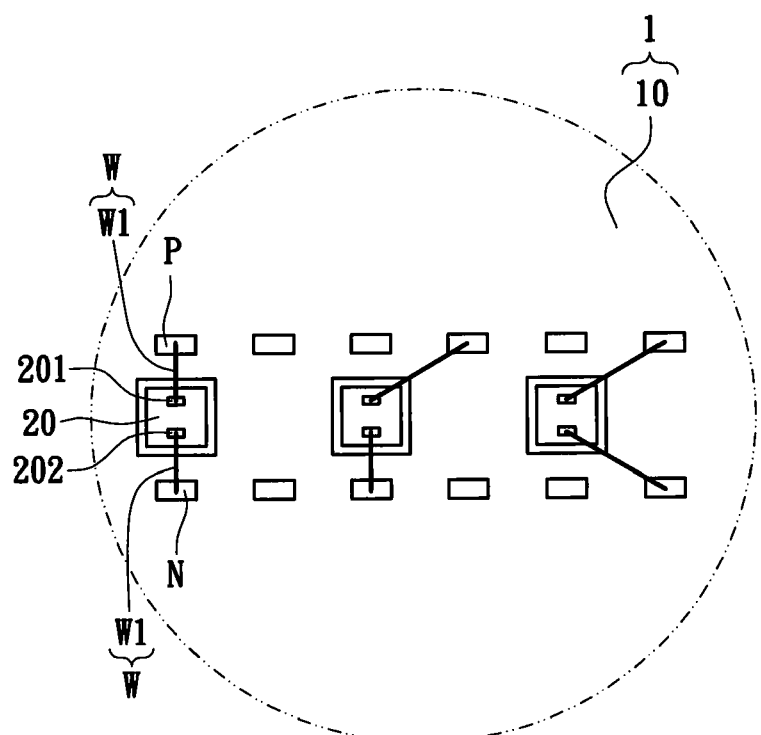
FIG. 11 shows a partial, top, schematic view of the substrate unit using standby pads.

Referring to FIG. 11, in the first to the tenth embodiments, the substrate unit 1 includes a plurality of positive pads P and negative pads N disposed on the top surface of the substrate body 10. Each light-emitting chip (20 or 20a, 20b) has a positive electrode 201 and a negative electrode 202. The positive electrode 201 of each light-emitting chip 20 corresponds to at least two of the positive pads P, and the negative electrode 202 of each light-emitting chip 20 corresponds to at least two of the negative pads N. In addition, the multichip package structure further comprises a conductive wire unit W including a plurality of conductive wires W1. Every two conductive wires W1 are respectively electrically connected between the positive electrode 201 of each light-emitting chip 20 and one of the at least two positive pads P and between the negative electrode 202 of each light-emitting chip 20 and one of the at least two negative pads N. Hence, the positive electrode 201 of each light-emitting chip 20 has at least one standby positive pad P and the negative electrode 202 of each light-emitting chip 20 has at least one standby negative pad N.

When a first end of the conductive wire W1 does not correctly connect with first one of the at least two positive pads P or the at least two negative pads N (it means that the conductive wire W1 does not electrically connect with the first one of the at least two positive pads P or the at least two negative pads N (such as floating solder)), the manufacturer can make the same first end of the conductive wire W1 connect to another one of the at least two positive pads P or the at least two negative pads N without cleaning solder splash on the surface of the first one of the at least two positive pads P or the at least two negative pads N, thus the wire-bonding time (the wire-bonding efficiency) can be decreased and the wire-bonding yield can be increased.

In conclusion, the first annular colloid frame (such as an annular white colloid frame) of any shapes can be formed by coating in the instant disclosure. In addition, the position of the first package colloid body such as cured phosphor colloid can be limited in the first colloid position limiting space by using the first annular colloid frame, and the shape of the first package colloid body can be adjusted by using the first annular colloid frame. Therefore, the instant disclosure can increase the light-emitting efficiency of the light-emitting chips and control the light-projecting angle of the light-emitting chips. In other words, the first package colloid body is limited in the first colloid position limiting space by using the first annular colloid frame, thus the usage quantity of the first package colloid body can be controlled by the manufacture. In addition, the surface shape and the height of the first package colloid body can be adjusted by controlling the usage quantity of the first package colloid body, thus the light-projecting angles of the white light beams can be adjusted. Moreover, the blue light beams generated by the light-emitting chips can be reflected by an inner wall of the first annular colloid frame, thus the light-emitting efficiency of the instant disclosure can be effectively increased.

Moreover, the positive electrode and the negative electrode of each light-emitting chip respectively correspond to at least two of the positive pads and at least two of the negative pads, thus the positive electrode of each light-emitting chip has at least one standby positive pad and the negative electrode of each light-emitting chip has at least one standby negative pad.

Furthermore, the light-emitting chips and the at least one current-limiting chip are electrically connected to the same substrate body, thus the multichip package structure can use the constant voltage power supply as power supply source.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A multichip package structure, comprising:
a substrate unit including a substrate body having a first chip-placing region and a second chip-placing region formed on the top surface of the substrate body;
a light-emitting unit including a plurality of light-emitting chips electrically connected to and disposed on the first chip-placing region;
a current-limiting unit including at least one current-limiting chip electrically connected to and disposed on the second chip-placing region, wherein the current-limiting chip is electrically connected between the light-emitting unit and a constant voltage power supply, and a constant voltage generated by the constant voltage power supply is transmitted to the light-emitting unit through the current-limiting chip;
a frame unit including a first annular colloid frame and a second annular colloid frame surroundingly formed on the top surface of the substrate body, wherein the first annular colloid frame surrounds the light-emitting chips to form a first colloid position limiting space corresponding to the first chip-placing region, and the second annular colloid frame surrounds the current-limiting chip to form a second colloid position limiting space corresponding to the second chip-placing region; and
a package unit including a first package colloid body filled into the first colloid position limiting space to cover the light-emitting chips and a second package colloid body filled into the second colloid position limiting space to cover the current-limiting chip.

2. The multichip package structure of claim 1, wherein the substrate body includes a circuit substrate, a heat-dissipating layer disposed on the bottom surface of the circuit substrate, a plurality conductive pads disposed on the top surface of the circuit substrate, and an insulative layer disposed on the top surface of the circuit substrate to expose the conductive pads, wherein each light-emitting chip is a blue LED, the first package colloid body is a cured phosphor colloid or a cured transparent colloid, and the second package colloid body is a cured opaque colloid.

3. The multichip package structure of claim 1, wherein the first annular colloid frame has an arc shape formed on the top surface thereof, the first annular colloid frame has a radius tangent and the angle of the radius tangent relative to the top surface of the substrate body is between 40° and 50°, the maximum height of the first annular colloid frame relative to the top surface of the substrate body is between 0.3 mm and 0.7 mm, the width of the bottom side of the first annular colloid frame is between 1.5 mm and 3 mm, the thixotropic index of the first annular colloid frame is between 4 and 6, and the first annular colloid frame is formed by mixing inorganic additive with white thermohardening colloid.

4. The multichip package structure of claim 1, wherein the substrate unit includes a plurality of positive pads and negative pads disposed on the top surface of the substrate body, each light-emitting chip has a positive electrode and a negative electrode, the positive electrode of each light-emitting chip corresponds to at least two of the positive pads, and the negative electrode of each light-emitting chip corresponds to at least two of the negative pads.

5. The multichip package structure of claim 4, further comprising: a conductive wire unit including a plurality of conductive wires, wherein every two conductive wires are respectively electrically connected between the positive electrode of each light-emitting chip and one of the at least two positive pads and between the negative electrode of each light-emitting chip and one of the at least two negative pads.

6. The multichip package structure of claim 1, wherein the first annular colloid frame and the second annular colloid frame are separated from each other by a predetermined distance, the first package colloid body and the second package colloid body are separated from each other by a predetermined distance, and the first annular colloid frame and the second package colloid body are separated from each other by a predetermined distance.

7. The multichip package structure of claim 1, wherein the second annular colloid frame surrounds the first annular colloid frame, the second package colloid body surrounds the first package colloid body, and the first annular colloid frame is connected with the second package colloid body.

8. The multichip package structure of claim 1, wherein the substrate unit includes at least one heat-insulating slot passing through the substrate body, and the heat-insulating slot is formed between the light-emitting unit and the current-limiting unit or between the first annular colloid frame and the second annular colloid frame.

9. A multichip package structure, comprising:
a substrate unit including a substrate body having two first chip-placing regions and a second chip-placing region formed on the top surface of the substrate body;
a light-emitting unit including at least one first light-emitting module for generating first color temperature and at least one second light-emitting module for generating second color temperature, wherein the first light-emitting module includes a plurality of first light-emitting chips electrically connected to and disposed on one of the first chip-placing regions, and the second light-emitting module includes a plurality of second light-emitting chips electrically connected to and disposed on the other first chip-placing region;
a current-limiting unit including at least one current-limiting chip electrically connected to and disposed on the second chip-placing region, wherein the current-limiting chip is electrically connected between the light-emitting unit and a constant voltage power supply, and a constant voltage generated by the constant voltage power supply is transmitted to the light-emitting unit through the current-limiting chip;
a frame unit including two first annular colloid frames and a second annular colloid frame surroundingly formed on the top surface of the substrate body, wherein the two first annular colloid frames respectively surround the first light-emitting module and the second light-emitting module to respectively form two first colloid position limiting spaces corresponding to the two first chip-placing regions, and the second annular colloid frame surrounds the current-limiting chip to form a second colloid position limiting space corresponding to the second chip-placing region; and
a package unit including two first package colloid bodies and a second package colloid body, wherein the two first package colloid bodies are respectively filled into the two first colloid position limiting spaces to respectively cover the first light-emitting module and the second light-emitting module, and the second package colloid body is filled into the second colloid position limiting space to cover the current-limiting chip.

10. A multichip package structure, comprising:
a substrate unit including a substrate body having two first chip-placing regions and a second chip-placing region formed on the top surface of the substrate body;
a light-emitting unit including at least one first light-emitting module for generating first color temperature and at least one second light-emitting module for generating second color temperature, wherein the first light-emitting module includes a plurality of first light-emitting chips electrically connected to and disposed on one of the first chip-placing regions, and the second light-emitting module includes a plurality of second light-emitting chips electrically connected to and disposed on the other first chip-placing region;
a current-limiting unit including at least one current-limiting chip electrically connected to and disposed on the second chip-placing region, wherein the current-limiting chip is electrically connected between the light-emitting unit and a constant voltage power supply, and a constant voltage generated by the constant voltage power supply is transmitted to the light-emitting unit through the current-limiting chip;
a frame unit including two first annular colloid frames and a second annular colloid frame surroundingly formed on the top surface of the substrate body, wherein one of the first annular colloid frames surrounds the other first annular colloid frame, the two first annular colloid frames respectively surround the first light-emitting module and the second light-emitting module to respectively form two first colloid position limiting spaces corresponding to the two first chip-placing regions, the second light-emitting module is disposed between the two first annular colloid frames, and the second annular colloid frame surrounds the current-limiting chip to form a second colloid position limiting space corresponding to the second chip-placing region; and
a package unit including two first package colloid bodies and a second package colloid body, wherein the two first package colloid bodies are respectively filled into the two first colloid position limiting spaces to respectively cover the first light-emitting module and the second light-emitting module, and the second package colloid body is filled into the second colloid position limiting space to cover the current-limiting chip.

* * * * *